(12) United States Patent
Ma

(10) Patent No.: US 9,881,550 B2
(45) Date of Patent: Jan. 30, 2018

(54) PIXEL CIRCUIT, DRIVING METHOD THEREOF, AND DISPLAY APPARATUS

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/122,375

(22) PCT Filed: Oct. 12, 2015

(86) PCT No.: PCT/CN2015/091727
§ 371 (c)(1),
(2) Date: Aug. 29, 2016

(87) PCT Pub. No.: WO2016/188012
PCT Pub. Date: Dec. 1, 2016

(65) Prior Publication Data
US 2017/0169761 A1 Jun. 15, 2017

(30) Foreign Application Priority Data

May 28, 2015 (CN) .......................... 2015 1 0284605

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *G09G 3/3291* (2013.01);
(Continued)

(58) Field of Classification Search
CPC .. G09G 3/3233; G09G 3/3258; G09G 3/3291; G09G 2300/0819;
(Continued)

(56) References Cited

U.S. PATENT DOCUMENTS

2005/0225251 A1 10/2005 Hseuh
2010/0127955 A1 5/2010 Choi

FOREIGN PATENT DOCUMENTS

| CN | 1735293 A | 2/2006 |
| CN | 103000127 A | 3/2013 |
| CN | 104835452 A | 8/2015 |

OTHER PUBLICATIONS

International Search Report and Written Opinion from PCT Application Serial No. PCT/CN2015/091727, dated Mar. 3, 2016, 12 pages.

*Primary Examiner* — Michael Pervan
(74) *Attorney, Agent, or Firm* — Kinney & Lange, P.A.

(57) ABSTRACT

Disclosed are a pixel Circuit, a driving method thereof, and a display apparatus. The pixel circuit comprises a driving transistor, a capacitor connected between the source and the gate of the driving transistor, a light-emitting element, a light-emitting control module, a data writing module and a compensating module. By cooperation among the various modules, the drift of the threshold voltage of the driving transistor can be compensated. Accordingly, the driving current which is provided by the driving transistor to drive the light-emitting element to emit light only relates to the voltage of the data signal and the reference signal, while does not relate to the threshold voltage of the driving transistor and the first reference voltage source, and thus the effect on the current flowing through the light-emitting element raised due to the threshold voltage and due to the IR drop can be avoided. The operating current which drives the light-emitting element to emit lights can remain uniform, (Continued)

thereby improving the uniformity of the image luminance of the whole display area of the display apparatus.

15 Claims, 9 Drawing Sheets

(51) Int. Cl.
*G09G 3/3291* (2016.01)
*H01L 27/32* (2006.01)

(52) U.S. Cl.
CPC ...... *H01L 27/3262* (2013.01); *H01L 27/3265* (2013.01); *H01L 27/3276* (2013.01); *G09G 2300/0819* (2013.01); *G09G 2320/0233* (2013.01); *G09G 2320/045* (2013.01); *G09G 2320/0626* (2013.01)

(58) Field of Classification Search
CPC ..... G09G 2320/0233; G09G 2320/045; G09G 2320/0626; H01L 27/3262; H01L 27/3265; H01L 27/3276
USPC .................................. 345/74.1–83, 690–697
See application file for complete search history.

PIXEL CIRCUIT, DRIVING METHOD THEREOF, AND DISPLAY APPARATUS

CROSS-REFERENCE TO RELATED APPLICATION(S)

This application claims priority to Chinese Application No. 201510284605.2, filed on May 28, 2015, entitled "a Pixel Circuit, Driving Method thereof and related Apparatus", which is incorporated herein by reference in its entirety.

TECHNICAL FIELD

The present disclosure relates to the technical field of organic electroluminescence, and in particular, to a pixel circuit, a driving method thereof, and a display apparatus.

BACKGROUND

An Organic Light Emitting Diode (OLED) display is a hot topic of the current research of panel display. Compared with a liquid crystal display, OLED has advantages of lower power consumption, lower product cost, self-emitting, a wider angle of view, and a quicker response speed. At present, in a panel display, such as mobile phones, PADs, digital cameras, an OLED display had replaced the traditional Liquid Crystal Display (LCD). The design of the pixel circuit is the core of an OLED, and shall be considered carefully.

Differently from an LCD which uses a stable voltage to control the luminance, an OLED display is driven by a current, and thus needs a stable current to control the luminance. Due to the processing procedure and aging of the devices, the threshold voltage $V_{th}$ of the driving transistor in the pixel circuit is non-uniform, which causes the currents flowing through each pixel in the OLED display change and thus the luminance of pixels are uneven, and affects the display effect of the whole image. Furthermore, since the current relates to the source of the driving transistor, i.e., the supply voltage, the IR drop will raise difference in the currents at different areas, which causes the luminance of the OLED display is different at different areas.

FIG. 1 shows a diagram of a conventional pixel circuit. As shown in FIG. 1, a pixel circuit of 2 M1C comprises one driving transistor M2, one switch transistor M1 and one storage capacitor Cs. When the scan line Scan selects a row, the scan line Scan inputs a low level signal, and the P-type switch transistor M1 turns on, and the voltage on the data line Data is written into the storage capacitor Cs; when the row has been scanned, the scan line Scan inputs a high level signal, and the P-type switch transistor M1 turns off, the gate voltage stored in the storage capacitor Cs generates a current in the driving transistor M2 to drive the OLED display, so as to ensure that the OLED display is luminous consistently during a frame. The equation of the saturation current of the driving transistor M2 reads as $I_{OLED}=K(V_{gs}-V_{th})^2$. As discussed above, the threshold voltage $V_{th}$ of the driving transistor M2 will drift due to the processing procedure and aging of the devices, and Vs will be different due to IR drop since the current relates to the supply voltage. Accordingly, the current flowing through each OLED varies as the threshold voltage $V_{th}$ of the driving transistor and the source voltage VDD of the driving transistor, which causes non-uniformity of the image luminance.

SUMMARY

In view of the above one or more problems of the prior art, embodiments of the present disclosure provides a pixel circuit, a driving method thereof, and a display apparatus which can effectively compensate the difference of the current which raises due to non-uniformity and shift of the threshold voltage of the driving transistor and the non-uniformity of the OLED, thereby improving the display effect of the display apparatus.

In embodiments of the present disclosure, a pixel circuit is provided, comprising a driving transistor, a capacitor connected between a source and a gate of the driving transistor, a light-emitting element, a light-emitting control module, a data writing module and a compensating module, the data writing module being configured to provide a data signal to the source of the driving transistor under the control of a write control signal, the compensating module being configured to provide a sum of a reference voltage and a preset threshold voltage to the gate of the driving transistor under the control of a compensation control signal; wherein an absolute value of a difference between the preset threshold voltage and the threshold voltage of the driving threshold is lower than a preset limit; and the light-emitting control module is configured to, under the control of a light-emitting control signal, provide a voltage of a first reference voltage source to the source of the driving transistor and provide a driving current outputted from the drain of the driving transistor to the light-emitting element to drive it to emit lights.

In particular, the data writing module has a first input terminal configured to receive the write control signal, a second input terminal configured to receive the data signal, and an output terminal connected to the source of the driving transistor.

In particular, the compensating module has a first input terminal configured to receive the reference voltage, a second input terminal configured to receive the compensation control signal, and an output terminal connected to the gate of the driving transistor.

In particular, the light-emitting control module has a first input terminal connected to the first reference voltage source, a second input terminal configured to receive the light-emitting control signal, a third input terminal connected to the drain of the driving transistor, a first output terminal connected to the source of the driving transistor, a second output terminal connected to an end of the light-emitting element, the light-emitting element having another end connected to a second reference voltage source.

In a possible embodiment, in the pixel circuit according to the embodiments of the present disclosure, the data writing module comprises a first switch transistor having a gate being the first input terminal of the data writing module, a source being the second input terminal of the data writing module and a drain being the output terminal of the data writing module.

In a possible embodiment, in the pixel circuit according to the embodiments of the present disclosure, the compensating module comprises a second switch transistor and a third switch transistor, the second switch transistor having a gate being the second input terminal of the compensating module, a source connected to the gate and the drain of the third switch transistor, and a drain being the output terminal of the compensating module, and the third switch transistor has a source being the first input terminal of the compensating module, the threshold voltage of the third switch transistor being the preset threshold voltage.

Preferably, in the pixel circuit according to the embodiments of the present disclosure, the third switch transistor has a size and a shape that are the same as those of the driving transistor, and the third switch transistor is positioned close to the driving transistor.

In a possible embodiment, in the pixel circuit according to the embodiments of the present disclosure, the light-emitting control module comprises a fourth switch transistor having a gate being the second input terminal of the light-emitting control module, a source being the first input terminal of the light-emitting control module, and a drain being the first output terminal of the light-emitting control module, and a fifth switch transistor having a gate connected to the gate of the fourth switch transistor, a source being the third input terminal of the light-emitting control module, and a drain being the second output terminal of the light-emitting control module.

In a possible embodiment, in the pixel circuit according to the embodiments of the present disclosure, the absolute value of the difference between the preset threshold voltage and the threshold voltage of the driving threshold is lower than 0.04V.

Preferably, in the pixel circuit according to the embodiments of the present disclosure, the compensation control signal is the write control signal.

In embodiments of the present disclosure, a driving method for any of the pixel circuits is provided, comprising a write phase in which the data writing module provides the data signal to the source of the driving transistor under the control of the write control signal, and the compensating module provides a sum of the reference voltage and the preset threshold voltage to the gate of the driving transistor under the control of the compensation control signal, wherein the absolute value of the difference between the preset threshold voltage and the threshold voltage of the driving threshold is lower than a preset limit, and a light-emitting phase in which the light-emitting control module provides the voltage of the first reference voltage source to the source of the driving transistor and provides a driving current outputted from the drain of the driving transistor to the light-emitting element to drive it to emit lights, under the control of the light-emitting control signal.

Preferably, in the driving method according to the embodiments of the present disclosure, the data writing module comprises a first switch transistor having a gate being the first input terminal of the data writing module, a source being the second input terminal of the data writing module and a drain being the output terminal of the data writing module.

At the write phase, the first switch transistor turns on under the write control signal, so as to provide the data signal to the source of the driving transistor.

Preferably, in the driving method according to the embodiments of the present disclosure, the compensating module comprises a second switch transistor and a third switch transistor, the second switch transistor having a gate being the second input terminal of the compensating module, a source connected to the gate and the drain of the third switch transistor, and a drain being the output terminal of the compensating module, and the third switch transistor having a source being the first input terminal of the compensating module, the threshold voltage of the third switch transistor being the preset threshold voltage.

At the write phase, the second switch transistor turns on under the control of the compensation control signal, and the third switch transistor has a turn-on diode structure; the reference voltage is inputted to the gate of the driving transistor via the turn-on diode structure and the second switch transistor.

Preferably, in the driving method according to the embodiments of the present disclosure, the light-emitting control module comprises a fourth switch transistor having a gate being the second input terminal of the light-emitting control module, a source being the first input terminal of the light-emitting control module, and a drain being the first output terminal of the light-emitting control module, and a fifth switch transistor having a gate connected to the gate of the fourth switch transistor, a source being the third input terminal of the light-emitting control module, and a drain being the second output terminal of the light-emitting control module.

At the light phase, the fourth switch transistor and the fifth switch transistor both turn on under the control of the light-emitting control signal; the voltage of the first reference voltage source is inputted to the source of the driving transistor via the fourth switch transistor, and the driving current outputted from the drain of the driving transistor is outputted to the light-emitting element via the fifth switch transistor.

In embodiments of the present disclosure, an organic electroluminescence display panel is provided, comprising a plurality of pixel elements arranged in a grid, the pixel elements each comprising any of the pixel circuit provided according to the embodiments of the present disclosure.

Preferably, in the organic electroluminescence display panel according to the embodiments of the present disclosure, the compensating module of the pixel circuit comprises a second switch transistor and a third switch transistor, the second switch transistor having a gate being the second input terminal of the compensating module, a source connected to the gate and drain of the third switch transistor, and a drain being the output terminal of the compensating module, the third switch transistor having a source being the first input terminal of the compensating module, the threshold voltage of the third switch transistor being the preset threshold voltage. Two pixel elements adjacent in a row constitute a group of pixel elements, and two pixel circuits in the same group of pixel elements share the third switch transistor.

In embodiments of the present disclosure, a display apparatus is provided, comprising any of the organic electroluminescence display panel provided according to the embodiments of the present disclosure.

The pixel circuit, the driving method thereof, and the display apparatus provided according to the embodiments of the present disclosure each comprise a driving transistor, a capacitor connected between the source and the gate of the driving transistor, a light-emitting element, a light-emitting control module, a data writing module and a compensating module. By cooperation among the various modules, the drift of the threshold voltage of the driving transistor can be compensated. Accordingly, the driving current which is provided by the driving transistor to drive the light-emitting element to emit light only relates to the voltage of the data signal and the reference signal, while does not relate to the threshold voltage of the driving transistor and the first reference voltage source, and thus the effect on the current flowing through the light-emitting element raised due to the threshold voltage and due to the IR drop can be avoided. The operating current which drives the light-emitting element to emit lights can remain uniform, thereby improving the uniformity of the image luminance of the whole display area of the display apparatus.

DETAILED DESCRIPTION

Specific embodiments of the pixel circuit, the driving method and related apparatus according to the present disclosure will be described in detail below with reference to the drawings.

Figure 1:
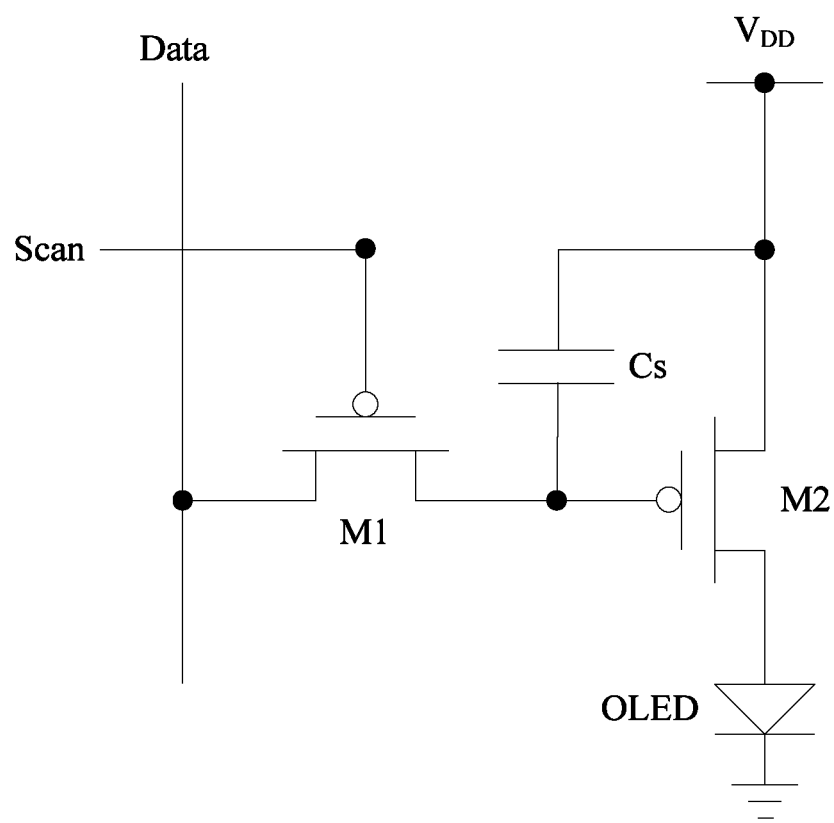
FIG. 1 shows a diagram of a conventional pixel circuit.
Figure 2:
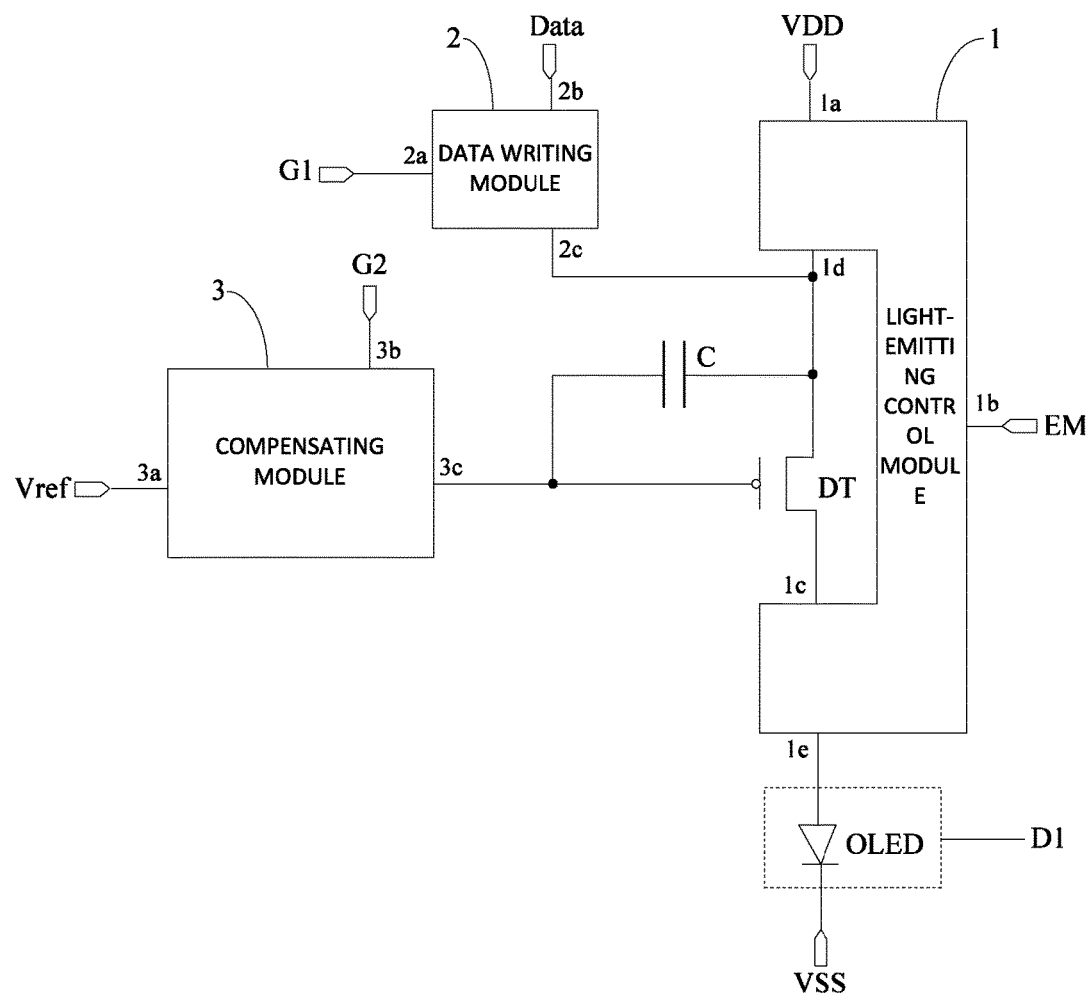
FIG. 2 is a diagram showing a pixel circuit according to an embodiment of the present disclosure.

FIG. 2 is a diagram showing a pixel circuit according to an embodiment of the present disclosure. As shown in FIG. 2, the pixel circuit according to an embodiment of the present disclosure comprises a driving transistor DT, a capacitor C connected between a source and a gate of the driving transistor DT, a light-emitting element D1, a light-emitting control module 1, a data writing module 2 and a compensating module 3.

The data writing module 2 has a first input terminal 2a configured to receive a write control signal G1, a second input terminal 2b configured to receive a data signal Data, and an output terminal 2c connected to the source of the driving transistor DT. The data writing module 2 is configured to provide the data signal Data to the source of the driving transistor DT under the control of the write control signal G1. The compensating module 3 has a first input terminal 3a configured to receive a reference voltage Vref, a second input terminal 3b configured to receive a compensation control signal G2, and an output terminal 3c connected to the gate of the driving transistor DT. The compensating module 3 is configured to provide a sum of the reference voltage Vref and a preset threshold voltage to the gate of the driving transistor DT under the control of the compensation control signal G2. The absolute value of the difference between the preset threshold voltage and the threshold voltage of the driving threshold DT is lower than a preset limit.

The light-emitting control module 1 has a first input terminal 1a connected to a first reference voltage source VDD, a second input terminal 1b configured to receive a light-emitting control signal EM, a third input terminal 1c connected to the drain of the driving transistor DT, a first output terminal 1d connected to the source of the driving transistor DT, a second output terminal 1e connected to an end of the light-emitting element D1, the light-emitting element D1 having another end connected to a second reference voltage source VSS. The light-emitting control module 1 is configured to, under the control of the light-emitting control signal EM, provide a voltage of the first reference voltage source VDD to the source of the driving transistor and provide a driving current outputted from the drain of the driving transistor DT to the light-emitting element D1 to drive it to emit lights.

The pixel circuit according to the embodiment of the present disclosure comprises a driving transistor, a capacitor connected between the source and the gate of the driving transistor, a light-emitting element, a light-emitting control module, a data writing module and a compensating module. By cooperation among the various modules, the drift of the threshold voltage of the driving transistor can be compensated. Accordingly, the driving current which is provided by the driving transistor to drive the light-emitting element to emit light only relates to the voltage of the data signal and the reference signal, while does not relate to the threshold voltage of the driving transistor and the first reference voltage source, and thus the effect on the current flowing through the light-emitting element raised due to the threshold voltage and due to the IR drop can be avoided. The operating current which drives the light-emitting element to emit lights can remain uniform, thereby improving the uniformity of the image luminance of the whole display area of the display apparatus.

The present disclosure will be described in detail below with reference to the embodiments. What shall be noted is that the embodiments are provided for the purpose of exemplification rather than limitation of the present disclosure.

Figure 3A:
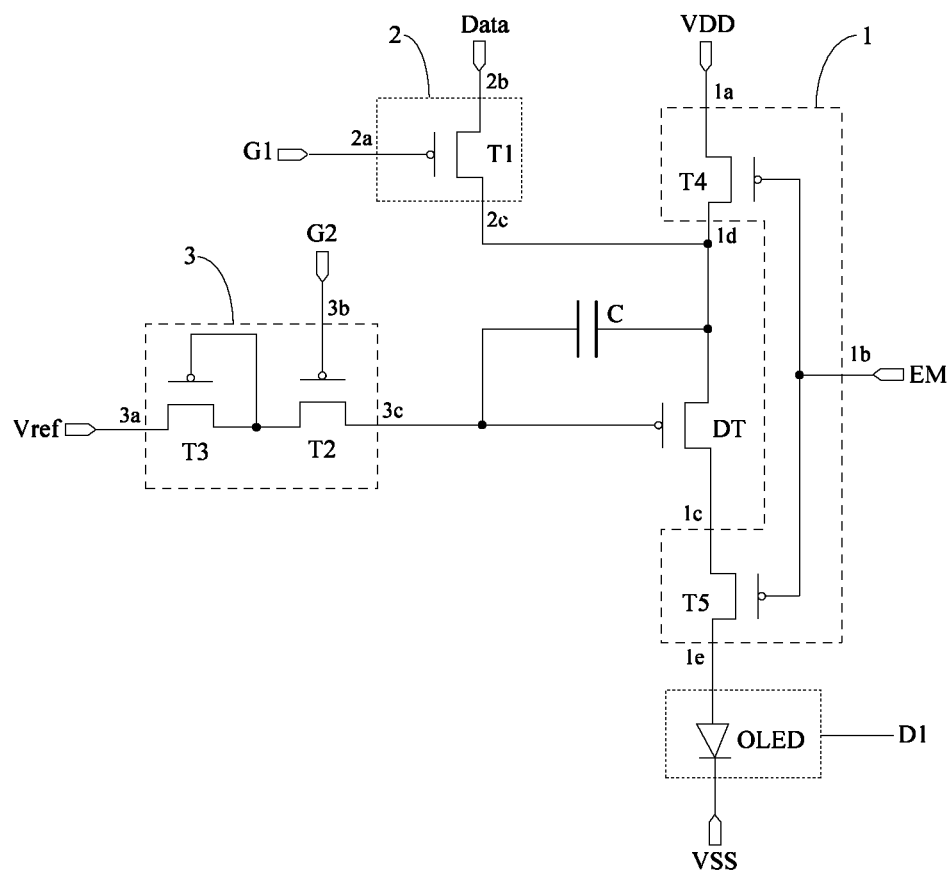
FIG. 3a to FIG. 3d are diagrams showing details of a pixel circuit according to an embodiment of the present disclosure.
Figure 3B:
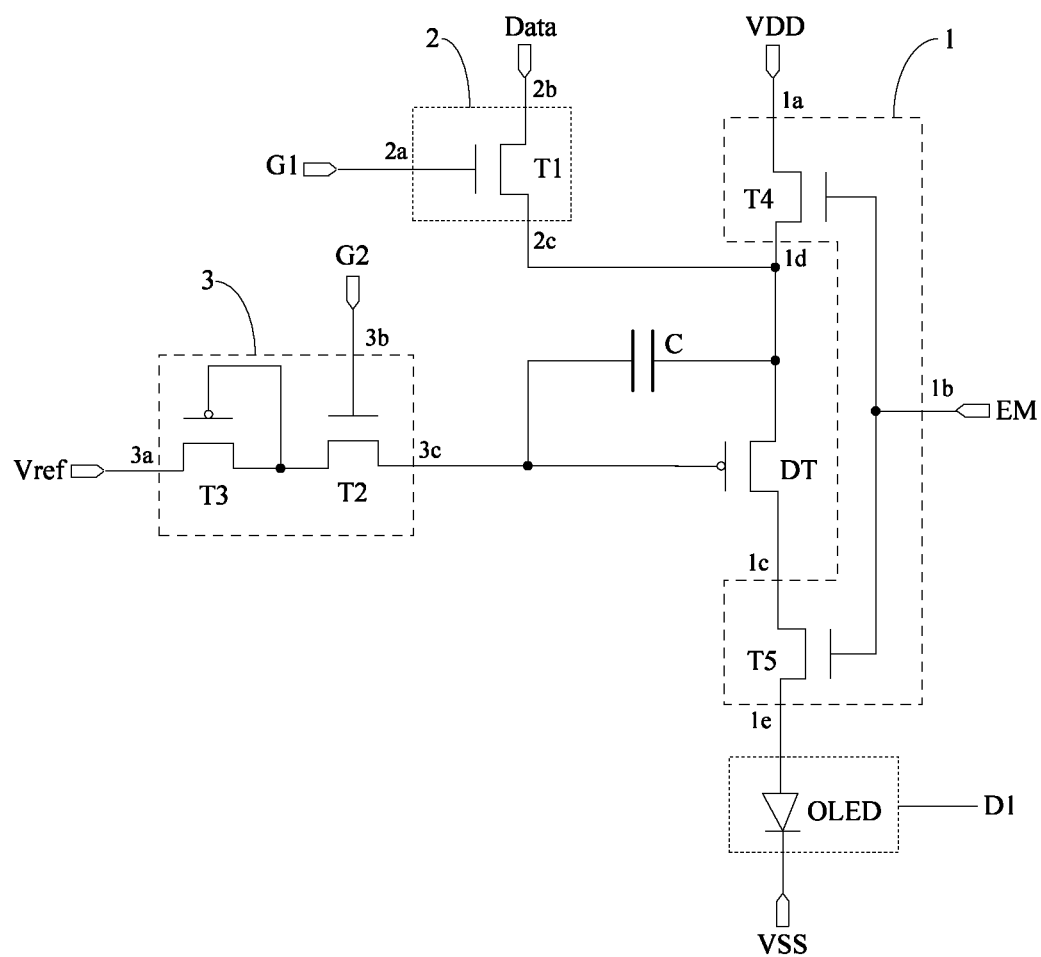

In the practical application, the light-emitting element D1 in the pixel circuit according to the embodiment of the present disclosure is generally an Organic Light Emitting Diode (OLED). As shown in FIGS. 3a and 3b, the anode of the OLED is a first end of the light-emitting element D1 connected to the second output terminal 1e of the light-emitting control module 1, and the cathode of the OLED is an end of the light-emitting element D1 connected to the second reference voltage source VSS. The OLED emits lights with the saturation current of the driving transistor DT.

In the practical application, in the pixel circuit according to the embodiment of the present disclosure, the driving transistor DT which drives the light-emitting element to emit lights is generally a P-type transistor. Since the threshold voltage Vth of a P-type transistor is a negative voltage, the voltage of the first reference voltage source is a positive voltage and the voltage of the second reference voltage source VSS is grounded or a negative voltage, to ensure the driving transistor DT to operate normally.

FIG. 3a to FIG. 3d are diagrams showing details of a pixel circuit according to an embodiment of the present disclosure.

Preferably, in the pixel circuit according to the embodiment of the present disclosure, the data writing module 2 may comprise a first switch transistor T1 as shown in FIGS. 3a and 3b.

The first switch transistor T1 has a gate being the first input terminal 2a of the data writing module 2, a source being the second input terminal 2b of the data writing module 2 and a drain being the output terminal 2c of the data writing module 2.

In particular, as shown in FIG. 3a, the first switch transistor T1 may be a P-type transistor in the practical application. In that case, the first switch transistor T1 turns on when the write control signal G1 is at a low level, and turns off when the write control signal G1 is at a high level. Alternatively, as shown in FIG. 3b, the first switch transistor T1 may also be a N-type transistor. In that case, the first switch transistor T1 turns on when the write control signal G1 is at a high level, and turns off when the write control signal G1 is at a low level. The present disclosure is not limited to this.

The foregoing merely illustrates the detail structure of the data writing module in the pixel circuit. In the practical application, the data writing module is not limited to the structure provided according to the embodiment of the present disclosure, and may have other structure known to skilled in the art. The present disclosure is not limited to this.

Preferably, in the pixel circuit according to the embodiment of the present disclosure, the compensating module 3 may comprise a second switch transistor T2 and a third switch transistor T3 as shown in FIGS. 3a and 3b.

The second switch transistor T2 has a gate being the second input terminal 3b of the compensating module 3, a source connected to the gate of the third switch transistor T3 and the drain of the third switch transistor T3, and a drain being the output terminal 3c of the compensating module 3.

The third switch transistor T3 has a source being the first input terminal 3a of the compensating module 3, and the threshold voltage of the third switch transistor T3 is the preset threshold voltage.

In particular, the third switch transistor T3 may be the same type of transistor with the driving transistor DT in the practical application, i.e., a P-type transistor.

Preferably, in the pixel circuit according to the embodiment of the present disclosure, in order to have the threshold voltage of the third switch transistor close to the threshold voltage of the driving transistor, the third switch transistor has a size and a shape that are the same as those of the driving transistor, and the third switch transistor is positioned close to the driving transistor.

Preferably, in the pixel circuit according to the embodiment of the present disclosure, the difference between the preset threshold voltage and the threshold voltage of the driving transistor is zero, so as to exactly compensate the drift of the threshold voltage of the driving transistor. However, in the practical application, the current processing procedure cannot make the preset threshold voltage exactly equal to the threshold voltage of the driving transistor. Therefore, in order to achieve compensation to some extent, the absolute value of the difference between the preset threshold voltage and the threshold voltage of the driving transistor shall be lower than 0.04V.

In particular, as shown in FIG. 3, the second switch transistor T2 may be a P-type transistor in the practical application. In that case, the second switch transistor T2 turns on when the compensation control signal G2 is at a low level, and turns off when the compensation control signal G2 is at a high level. Alternatively, as shown in FIG. 3b, the second switch transistor T2 may also be a N-type transistor. In that case, the second switch transistor T2 turns on when the compensation control signal G2 is at a high level, and turns off when the compensation control signal G2 is at a low level. The present disclosure is not limited to this.

The foregoing merely illustrates the detail structure of the compensating module in the pixel circuit. In the practical application, the compensating module is not limited to the structure provided according to the embodiment of the present disclosure, and may have other structure known to skilled in the art. The present disclosure is not limited to this.

Figure 3C:
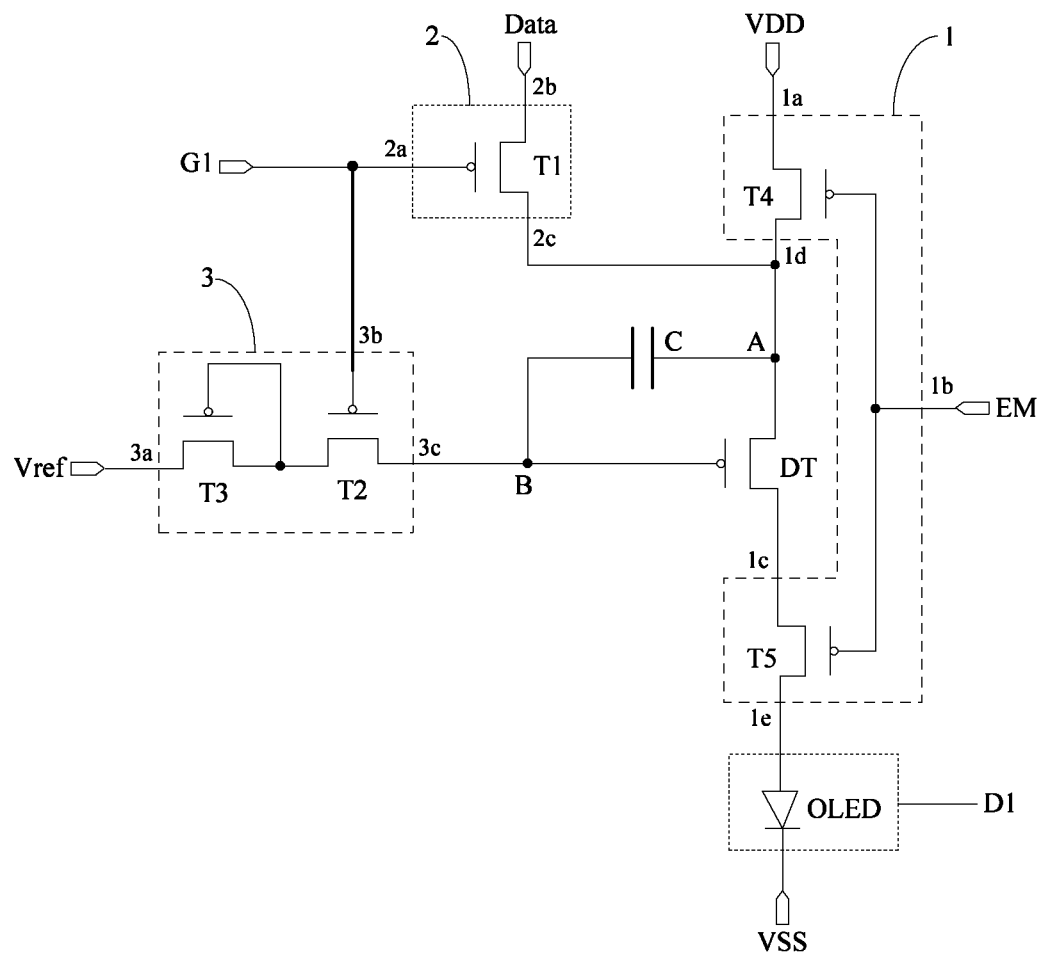
Figure 3D:
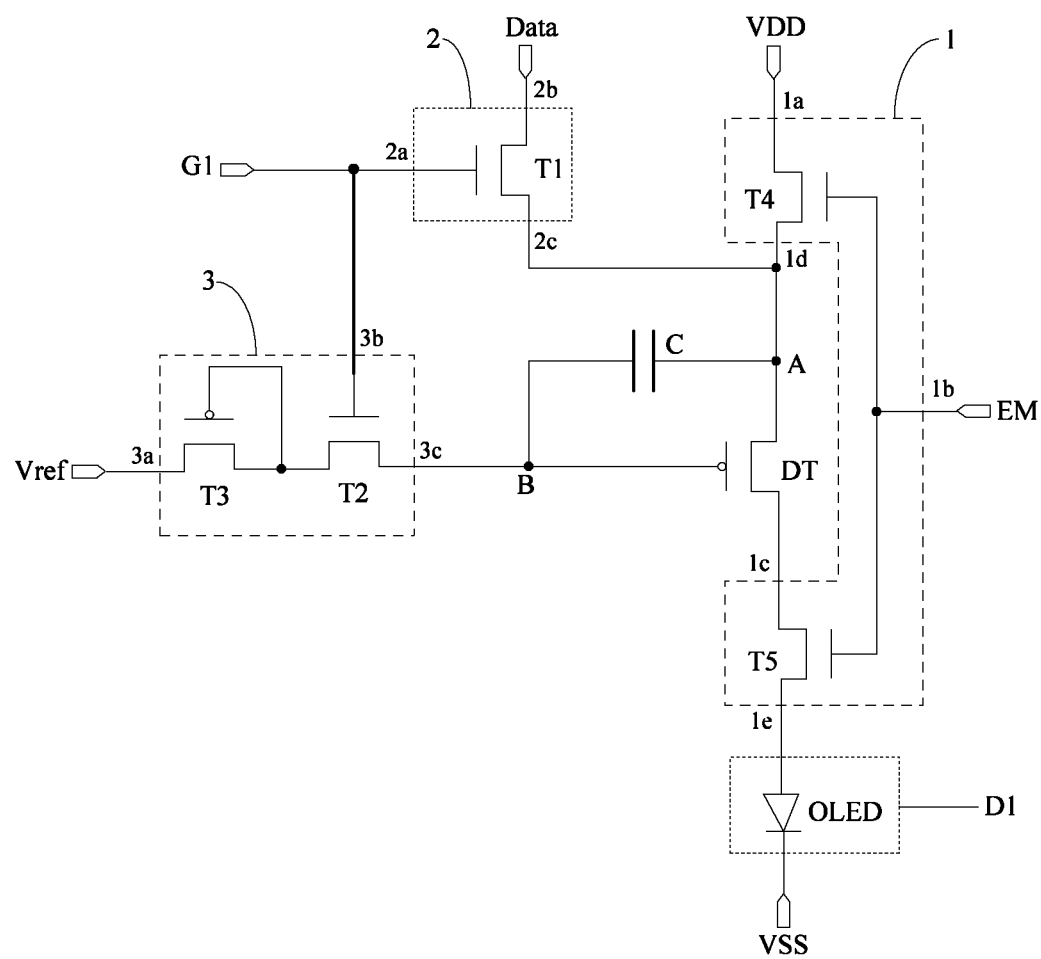

Preferably, in the pixel circuit according to the embodiment of the present disclosure, as shown in FIGS. 3a and 3d, when the data writing module 1 comprises the first switch transistor T1 and the compensating module 3 comprises the second switch transistor T2 and the third switch transistor T3, the first switch transistor T1 and the second switch transistor T2 both shall be the P-type transistors or the N-type transistors if the compensation control signal G2 is the switch control signal G1, or in other words, the compensation control signal G2 and the switch control signal G1 are the same signal.

Preferably, in the pixel circuit according to the embodiment of the present disclosure, the light-emitting control module 1 may comprise a fourth switch transistor T4 and a fifth switch transistor T5 as shown in FIGS. 3a and 3b.

The fourth switch transistor T4 has a gate being the second input terminal 1b of the light-emitting control module 1, a source being the first input terminal 1a of the light-emitting control module 1, and a drain being the first output terminal 1d of the light-emitting control module 1. The fifth switch transistor T5 has a gate connected to the gate of the fourth switch transistor T4, a source being the third input terminal 1c of the light-emitting control module 1, and a drain being the second output terminal 1e of the light-emitting control module 1.

In particular, as shown in FIG. 3a, the fourth switch transistor T4 and the fifth switch transistor T5 may be P-type transistors in the practical application. In that case, the fourth switch transistor T4 and the fifth switch transistor T5 turn on when the light-emitting control signal EM is at a low level, and turn off when the light-emitting control signal EM is at a high level. Alternatively, as shown in FIG. 3b, the fourth switch transistor T4 and the fifth switch transistor T5 may also be N-type transistors. In that case, the fourth switch transistor T4 and the fifth switch transistor T5 turn on when the light-emitting control signal EM is at a high level, and turn off when the light-emitting control signal EM is at a low level. The present disclosure is not limited to this.

The foregoing merely illustrates the detail structure of the light-emitting control module in the pixel circuit. In the practical application, the light-emitting control module is not limited to the structure provided according to the embodiment of the present disclosure, and may have other structure known to skilled in the art. The present disclosure is not limited to this.

What shall be noted is that the driving transistor and the switch transistors mentioned in the embodiment of the present disclosure may be Thin Film Transistors (TFTs), or Metal Oxide Semiconductor (MOS) field-effect tubes. The present disclosure is not limited to this. In the practical application, the source and the drain of the transistors may be exchanged, and the present disclosure does not make a distinction between them. In describing the embodiment, the driving transistor and the switch transistors are all TFTs as an example.

Preferably, the driving transistor and the switch transistors mentioned in the embodiment of the present disclosure may be designed as P-type transistors, to simplify the production process of the pixel circuit.

The operation of the pixel circuit according to the embodiment of the present disclosure will be described below with reference to the pixel circuit shown in FIGS. 3c and 3d. In order to simplify the description, it is specified that the gate of the driving transistor DT is a first node A, and the source of the driving transistor DT is a second node B. In the following description, 1 denotes a high level signal, and 0 denotes a low level signal.

Figure 4A:
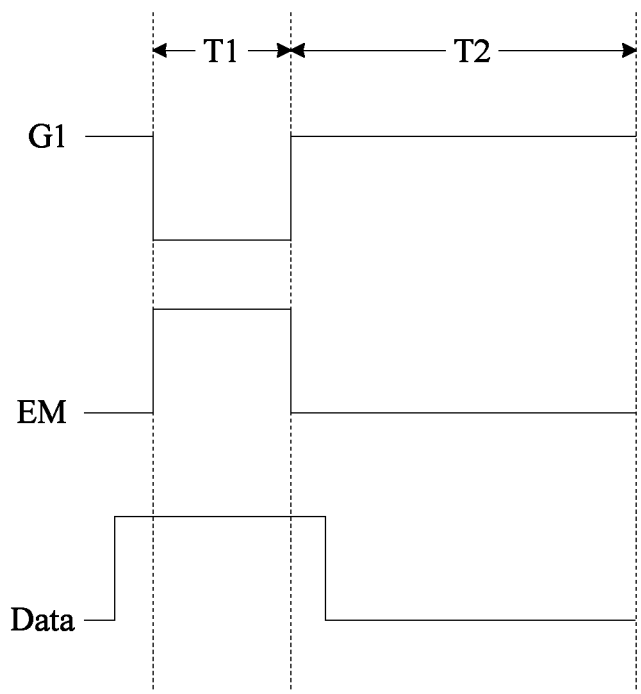
FIG. 4a is a sequence diagram of the pixel circuit shown in FIG. 3c.

FIG. 4a is a sequence diagram of the pixel circuit shown in FIG. 3c. The operation of the pixel circuit is described with reference to the pixel circuit shown in FIG. 3c. In the pixel circuit shown in FIG. 3c, the driving transistor is a P-type transistor and all the switch transistors are P-type transistors which turn off under the control of a high level signal and turn on under the control of a low level signal. The input sequence diagram is shown in FIG. 4a. In particular, two phases, T1 and T2, in the input sequence diagram shown in FIG. 4a are taken.

At T1 phase, G1=0 and EM=1. The first switch transistor T1 and the second switch transistor T2 turn on. The third switch transistor T3 has a diode structure. The fourth switch transistor T4 and the fifth switch transistor T5 turn off. The voltage at the first node A is the voltage $V_{data}$ of the data signal Data since the first switch transistor T1 turns on. The diode structure constituted by the third switch transistor T3 also turns on since the second switch transistor T2 turns on. The reference voltage Vref becomes Vref+$V_{th3}$ after it passes the turn-on diode structure (where $V_{th3}$ is the threshold voltage of the third switch transistor T3, which is a negative voltage since the third switch transistor T3 is a P-type transistor). The voltage Vref+$V_{th3}$ is outputted to the second node B after it passes the second switch transistor T2 which turns on. The voltage at the second node B becomes Vref+$V_{th3}$. Accordingly, the voltage across the capacitor C is $V_{data}$-(Vref+$V_{th3}$), and the OLED turns off and does not emit lights.

At T2 phase, G1=1 and EM=0. The first switch transistor T1 and the second switch transistor T2 turn off. The third switch transistor T3 has a diode structure. The fourth switch transistor T4 and the fifth switch transistor T5 turn on. The voltage at the first node A becomes the voltage $V_{DD}$ of the first reference voltage source since the fourth switch transistor T4 turns on. According to the principle of conservation of energy, the voltage at the second node B becomes $V_{DD}$-[$V_{data}$-(Vref+$V_{th3}$)]. Accordingly, at the phase, the voltage at the gate of the driving transistor DT remains at $V_{DD}$-[$V_{data}$-(Vref+$V_{th3}$)]. The driving transistor DT is in a saturation state. According to the current characteristics of the saturation state, the operating current IOLED which flows through the driving transistor DT and drives the OLED to emit lights satisfies the equation $I_{OLED}=K(V_{gs}-V_{th0})^2=K\{V_{DD}-[V_{Data}-(Vref+V_{th3})]-V_{DD}-V_{th0}\}^2=K[(Vref-V_{Data})+V_{th3}-V_{th0}]^2$, where K is a configuration parameter and stays stable in the same structure, and thus it can be taken as a constant. $V_{th0}$ is the threshold voltage of the driving transistor DT. Since the absolute value of the difference between the threshold voltage $V_{th3}$ of the third switch transistor T3 and the threshold voltage $V_{th0}$ of the driving transistor DT is a small voltage value, $V_{th3}-V_{th0}$ hardly affects $I_{OLED}$. Accordingly, the third switch transistor compensates the drift of the threshold voltage of the driving transistor. Furthermore, when the difference between the threshold voltage $V_{th3}$ of the third switch transistor T3 and the threshold voltage $V_{th0}$ of the driving transistor DT is zero, that is, the threshold voltage $V_{th3}$ of the third switch transistor T3 equates to the threshold voltage $V_{th0}$ of the driving transistor DT, $I_{OLED}=K$ (Vref-$V_{Data}$)$^2$. It can be seen that the threshold voltage $V_{th0}$ of the driving transistor will not affect the operating current of the OLED. Moreover, the operating current of the OLED is independent on the voltage of the first reference voltage source VDD, and only relates to the voltage $V_{data}$ of the data signal and the reference voltage Vref. The drift of the threshold voltage $V_{th0}$ of the driving transistor DT raised due to the processing procedure and a long time operation and the effect on the operating current $I_{OLED}$ of the light-emitting element D1 raised due to the IR drop can be avoided completely, thereby improving the non-uniformity of the display panel.

Figure 4B:
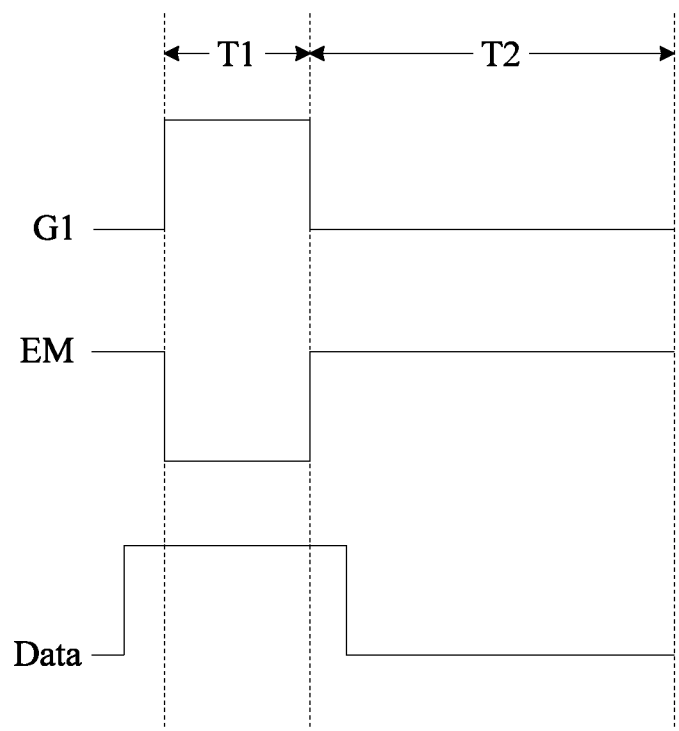
FIG. 4b is a sequence diagram of the pixel circuit shown in FIG. 3d.

FIG. 4b is a sequence diagram of the pixel circuit shown in FIG. 3d. The operation of the pixel circuit is described with reference to the pixel circuit shown in FIG. 3d. In the pixel circuit shown in FIG. 3d, the driving transistor and the third switch transistor are P-type transistor, and all the other switch transistors are N-type transistors which turn off under the control of a high level signal and turn on under the control of a low level signal. The input sequence diagram is shown in FIG. 4b. In particular, two phases, T1 and T2, in the input sequence diagram shown in FIG. 4b are taken as examples.

At T1 phase, G1=1 and EM=0. The first switch transistor T1 and the second switch transistor T2 turn on. The third switch transistor T3 has a diode structure. The fourth switch transistor T4 and the fifth switch transistor T5 turn off. The voltage at the first node A is the voltage $V_{data}$ of the data signal Data since the first switch transistor T1 turns on. The diode structure constituted by the third switch transistor T3 also turns on since the second switch transistor T2 turns on. The reference voltage Vref becomes Vref+$V_{th3}$ after it passes the turn-on diode structure (where $V_{th3}$ is the threshold voltage of the third switch transistor T3, which is a negative voltage since the third switch transistor T3 is a P-type transistor). The voltage Vref+$V_{th3}$ is outputted to the second node B after it passes the second switch transistor T2 which turns on. The voltage at the second node B becomes Vref+$V_{th3}$. Accordingly, the voltage across the capacitor C is $V_{data}$-(Vref+$V_{th3}$), and the OLED turns off and does not emit lights.

At T2 phase, G1=0 and EM=1. The first switch transistor T1 and the second switch transistor T2 turn off. The third switch transistor T3 has a diode structure. The fourth switch transistor T4 and the fifth switch transistor T5 turn on. The voltage at the first node A becomes the voltage $V_{DD}$ of the first reference voltage source since the fourth switch transistor T4 turns on. According to the principle of conservation of energy, the voltage at the second node B becomes $V_{DD}$-[$V_{data}$-(Vref+$V_{th3}$)]. Accordingly, at the phase, the voltage at the gate of the driving transistor DT remains at $V_{DD}$-[$V_{data}$-(Vref+$V_{th3}$)]. The driving transistor DT is in a saturation state. According to the current characteristics of the saturation state, the operating current IOLED which flows through the driving transistor DT and drives the OLED to emit lights satisfies the equation $I_{OLED}=K(V_{gs}-V_{th0})^2=K\{V_{DD}-[V_{Data}-(Vref+V_{th3})]-V_{DD}-V_{th0}\}^2=K[(Vref-V_{Data})+V_{th3}-V_{th0}]^2$, where K is a configuration parameter and stays stable in the same structure, and thus it can be taken as a constant. $V_{th0}$ is the threshold voltage of the driving transistor DT. Since the absolute value of the difference between the threshold voltage $V_{th3}$ of the third switch transistor T3 and the threshold voltage $V_{th0}$ of the driving transistor DT is a small voltage value, $V_{th3}-V_{th0}$ hardly affects $I_{OLED}$. Accordingly, the third switch transistor compensates the drift of the threshold voltage of the driving transistor. Furthermore, when the difference between the threshold voltage $V_{th3}$ of the third switch transistor T3 and the threshold voltage $V_{th0}$ of the driving transistor DT is zero, that is, the threshold voltage $V_{th3}$ of the third switch transistor T3 equates to the threshold voltage $V_{th0}$ of the driving transistor DT, $I_{OLED}=K$ (Vref-$V_{Data}$)$^2$. It can be seen that the threshold voltage $V_{th0}$ of the driving transistor will not affect the operating current of the OLED. Moreover, the operating current of the OLED is independent on the voltage of the first reference voltage source VDD, and only relates to the voltage $V_{data}$ of the data signal and the reference voltage Vref. The drift of the threshold voltage $V_{th0}$ of the driving transistor DT raised due to the processing procedure and a long time operation and the effect on the operating current $I_{OLED}$ of the light-emitting element D1 raised due to the IR drop can be avoided completely, thereby improving the non-uniformity of the display panel.

Figure 5:
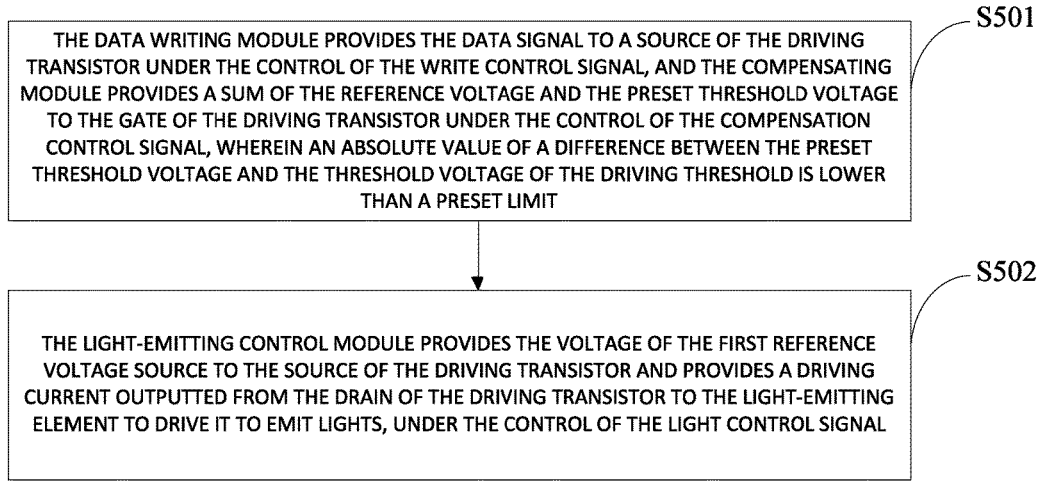
FIG. 5 is a flow chart showing a driving method of a pixel circuit according to an embodiment of the present disclosure.

With the same inventive concept, FIG. 5 is a flow chart showing a driving method of a pixel circuit according to an embodiment of the present disclosure. As shown in FIG. 5, the driving method of any pixel circuit mentioned before according to the embodiment of the present disclosure comprises the following steps.

At step S501 (the write phase), the data writing module provides the data signal to the source of the driving transistor under the control of the write control signal, and the compensating module provides a sum of the reference voltage and the preset threshold voltage to the gate of the driving transistor under the control of the compensation control signal, wherein the absolute value of the difference between the preset threshold voltage and the threshold voltage of the driving threshold is lower than a preset limit.

At step S502 (the light-emitting phase), the light-emitting control module provides the voltage of the first reference voltage source to the source of the driving transistor and provides a driving current outputted from the drain of the driving transistor to the light-emitting element to drive it to emit lights, under the control of the light-emitting control signal.

In the driving method according to the embodiment of the present disclosure, at the write phase, the data signal is provided to the source of the driving transistor, the sum of the reference voltage and the preset threshold voltage is provided to the gate of the driving transistor, and the absolute value of the difference between the preset threshold voltage and the threshold voltage of the driving threshold is lower than a preset limit. Accordingly, at the light-emitting phase, the driving current which is provided by the driving transistor to drive the light-emitting element to emit light only relates to the voltage of the data signal and the reference signal, while does not relate to the threshold voltage of the driving transistor and the first reference voltage source, and thus the effect on the current flowing through the light-emitting element raised due to the threshold voltage and due to the IR drop can be avoided. The operating current which drives the light-emitting element to emit lights can remain uniform, thereby improving the uniformity of the image luminance of the whole display area of the display apparatus.

Preferably, in the driving method according to the embodiment of the present disclosure, in the case that the data writing module comprises a first switch transistor, the first switch transistor has a gate being the first input terminal of the data writing module, a source being the second input terminal of the data writing module and a drain being the output terminal of the data writing module. At the write phase, the first switch transistor turns on under the write control signal, so as to provide the data signal to the source of the driving transistor.

Preferably, in the driving method according to the embodiment of the present disclosure, in the case that the compensating module comprises a second switch transistor and a third switch transistor, the second switch transistor has a gate being the second input terminal of the compensating module, a source connected to the gate and drain of the third switch transistor, and a drain being the output terminal of the compensating module, and the third switch transistor has a source being the first input terminal of the compensating module, the threshold voltage of the third switch transistor being the preset threshold voltage. At the write phase, the second switch transistor turns on under the control of the compensation control signal, and the third switch transistor has a turn-on diode structure; the reference voltage is inputted to the gate of the driving transistor via the turn-on diode structure and the second switch transistor.

Preferably, in the driving method according to the embodiment of the present disclosure, in the case that the light-emitting control module comprises a fourth switch transistor and a fifth switch transistor, the fourth switch transistor has a gate being the second input terminal of the light-emitting control module, a source being the first input terminal of the light-emitting control module, and a drain being the first output terminal of the light-emitting control module, and the fifth switch transistor has a gate connected to the gate of the fourth switch transistor, a source being the third input terminal of the light-emitting control module, and a drain being the second output terminal of the light-emitting control module. At the light phase, the fourth switch transistor and the fifth switch transistor both turn on under the control of the light-emitting control signal; the voltage of the first reference voltage source is inputted to the source of the driving transistor via the fourth switch transistor, and the driving current outputted from the drain of the driving transistor is outputted to the light-emitting element via the fifth switch transistor.

With the same inventive concept, embodiments of the present disclosure provide an organic electroluminescence display panel comprising a plurality of pixel elements arranged in a grid, the pixel elements each comprising any of the pixel circuit provided according to the embodiments of the present disclosure. The principle of solving the problem of the organic electroluminescence display panel is the same as the pixel circuit. For the implementation of the pixel circuit in the organic electroluminescence display panel, it may make reference to the implementation of the pixel circuits according to the embodiments of the present disclosure, which will not be described for simplicity.

Figure 6:
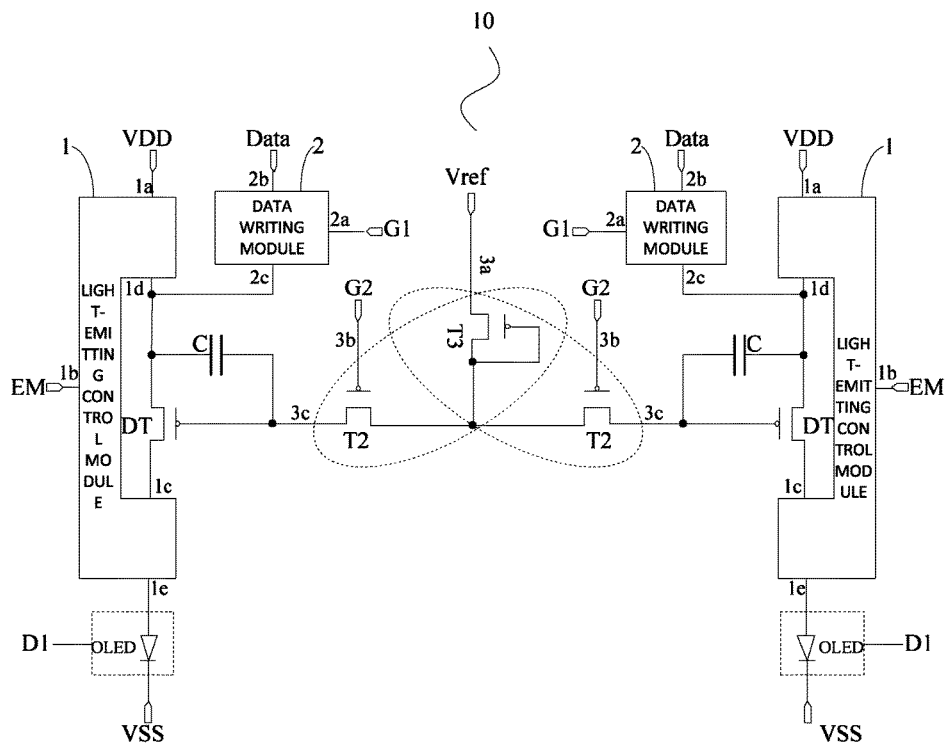
FIG. 6 is a diagram showing a group of pixel elements in an organic electroluminescence display panel according to an embodiment of the present disclosure.

FIG. 6 is a diagram showing a group of pixel elements in an organic electroluminescence display panel according to an embodiment of the present disclosure. Preferably, in the organic electroluminescence display panel according to the embodiments of the present disclosure, as shown in FIG. 6, the compensating module of the pixel circuit comprises a second switch transistor T2 and a third switch transistor T3. The second switch transistor T2 has a gate being the second input terminal 3b of the compensating module 3, a source connected to the gate and drain of the third switch transistor T3, and a drain being the output terminal 3c of the compensating module 3. The third switch transistor T3 has a source being the first input terminal 3a of the compensating module 3, the threshold voltage of the third switch transistor being the preset threshold voltage. Two pixel elements adjacent in a row constitute a group 10 of pixel elements, and two pixel circuits in the same group 10 of pixel elements share the third switch transistor T3.

Figure 7:
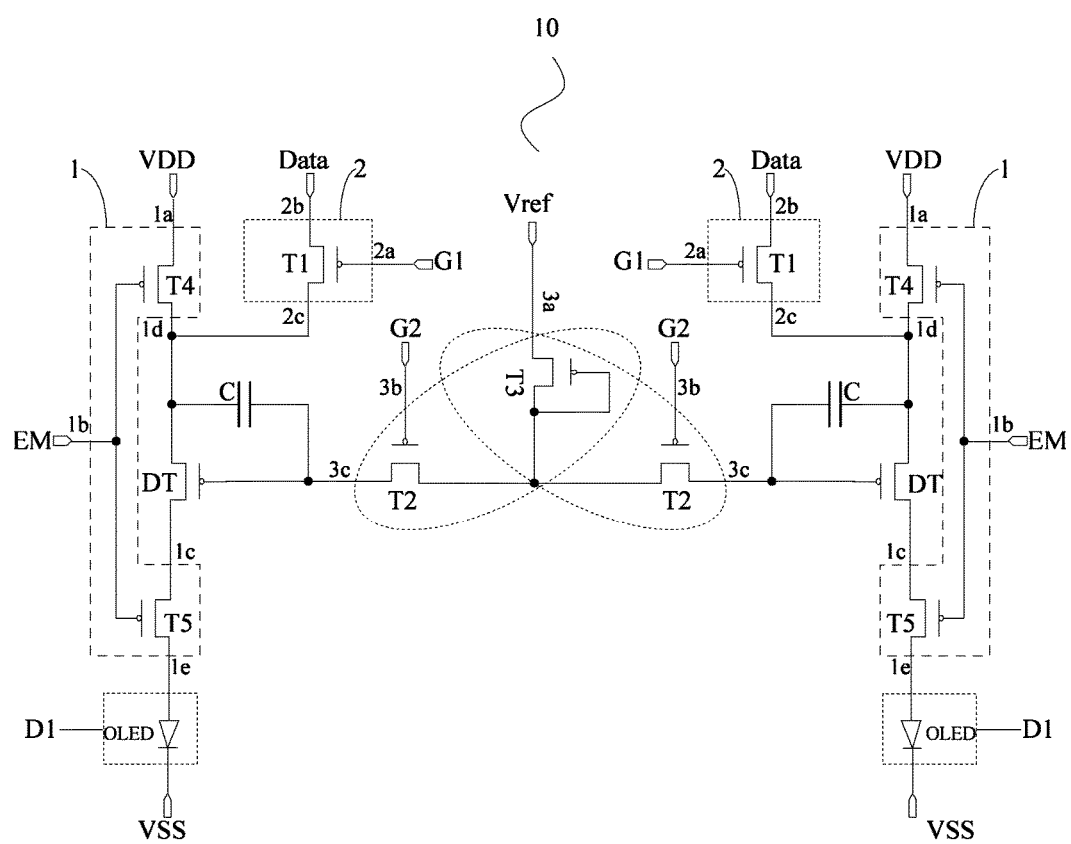
FIG. 7 is a diagram showing another group of pixel elements in an organic electroluminescence display panel according to an embodiment of the present disclosure.

FIG. 7 is a diagram showing another group of pixel elements in an organic electroluminescence display panel according to an embodiment of the present disclosure. In particular, in the practical application, when two pixel circuits in the same group 10 of pixel elements share the third switch transistor T3 in the organic electroluminescence display panel according to the embodiment of the present disclosure, as shown in FIG. 7, the data writing module 2 in the respective pixel circuit may comprise the first switch transistor T1, and the light-emitting control module 1 may comprise the fourth switch transistor T4 and the fifth switch transistor T5. For the connection among the first switch transistor T1, the fourth switch transistor T4 and the fifth switch transistor T5, it can make reference to the embodiments of the pixel circuits discussed above, which will not be described for simplicity.

With the same inventive concept, embodiments of the present disclosure provide a display apparatus comprising the organic electroluminescence display panel according to the embodiment of the present disclosure. The display apparatus may be a display, a mobile phone, a TV, a notebook, an all-in-one PC, and etc. Other components that are necessary for a display apparatus are well known to skilled in the art, which will not be described for simplicity and will not limit the present disclosure.

The pixel circuit, the driving method thereof, and the display apparatus provided according to the embodiments of the present disclosure each comprise a driving transistor, a capacitor connected between the source and the gate of the driving transistor, a light-emitting element, a light-emitting control module, a data writing module and a compensating module. By cooperation among the various modules, the drift of the threshold voltage of the driving transistor can be compensated. Accordingly, the driving current which is provided by the driving transistor to drive the light-emitting element to emit light only relates to the voltage of the data signal and the reference signal, while does not relate to the threshold voltage of the driving transistor and the first reference voltage source, and thus the effect on the current flowing through the light-emitting element raised due to the threshold voltage and due to the IR drop can be avoided. The operating current which drives the light-emitting element to emit lights can remain uniform, thereby improving the uniformity of the image luminance of the whole display area of the display apparatus.

Obviously, various changes and modifications can be made to the embodiments of the present disclosure by those skilled in the art without departing the spirit and scope of the present disclosure. If the changes and modifications fall into the scope of the claims and their equivalents, the changes and modifications are included in the disclosure.

I claim:

1. A pixel circuit, comprising
a driving transistor, a capacitor connected between a source and a gate of the driving transistor, a light-emitting element, a light-emitting control module, a data writing module and a compensating module, wherein
the data writing module is configured to provide a data signal to the source of the driving transistor under the control of a write control signal, and
the compensating module is configured to provide a sum of a reference voltage and a preset threshold voltage to the gate of the driving transistor under the control of a compensation control signal; wherein an absolute value of a difference between the preset threshold voltage and the threshold voltage of the driving threshold is lower than a preset limit; and
the light-emitting control module is configured to, under the control of a light-emitting control signal, provide a voltage of a first reference voltage source to the source of the driving transistor and provide a driving current outputted from the drain of the driving transistor to the light-emitting element to drive the light emitting element to emit light.

2. The pixel circuit according to claim 1, wherein
the data writing module has a first input terminal configured to receive the write control signal, a second input terminal configured to receive the data signal, and an output terminal connected to the source of the driving transistor;
the compensating module has a first input terminal configured to receive the reference voltage, a second input terminal configured to receive the compensation control signal, and an output terminal connected to the gate of the driving transistor;
the light-emitting control module has a first input terminal connected to the first reference voltage source, a second input terminal configured to receive the light-emitting control signal, a third input terminal connected to the drain of the driving transistor, a first output terminal connected to the source of the driving transistor, a second output terminal connected to an end of the light-emitting element, the light-emitting element having another end connected to a second reference voltage source.

3. The pixel circuit according to claim 2, wherein
the data writing module comprises a first switch transistor having a gate being the first input terminal of the data writing module, a source being the second input terminal of the data writing module and a drain being the output terminal of the data writing module.

4. The pixel circuit according to claim 2, wherein
the compensating module comprises a second switch transistor and a third switch transistor,
the second switch transistor has a gate being the second input terminal of the compensating module, a source connected to a gate and a drain of the third switch transistor, and a drain being the output terminal of the compensating module, and
the third switch transistor has a source being the first input terminal of the compensating module, the threshold voltage of the third switch transistor being the preset threshold voltage.

5. The pixel circuit according to claim 4, wherein
the third switch transistor has a size and a shape that are the same as those of the driving transistor, and the third switch transistor is positioned close to the driving transistor.

6. The pixel circuit according to claim 2, wherein
the light-emitting control module comprises a fourth switch transistor and a fifth switch transistor,
the fourth switch transistor has a gate being the second input terminal of the light-emitting control module, a source being the first input terminal of the light-emitting control module, and a drain being the first output terminal of the light-emitting control module, and
the fifth switch transistor has a gate connected to the gate of the fourth switch transistor, a source being the third input terminal of the light-emitting control module, and a drain being the second output terminal of the light-emitting control module.

7. The pixel circuit according to claim 1, wherein the absolute value of the difference between the preset threshold voltage and the threshold voltage of the driving threshold is lower than 0.04V.

8. The pixel circuit according to claim 1, wherein the compensation control signal is the write control signal.

9. A driving method for the pixel circuit according to claim 1, comprising
a write phase in which the data writing module provides the data signal to the source of the driving transistor under the control of the write control signal, and the compensating module provides a sum of the reference voltage and the preset threshold voltage to the gate of the driving transistor under the control of the compensation control signal, wherein the absolute value of the difference between the preset threshold voltage and the threshold voltage of the driving threshold is lower than a preset limit, and a light-emitting phase in which the light-emitting control module provides the voltage of the first reference voltage source to the source of the driving transistor and provides a driving current outputted from the drain of the driving transistor to the light-emitting element to drive the light emitting element to emit light, under the control of the light-emitting control signal.

10. The driving method according to claim 1, wherein the data writing module comprises a first switch transistor having a gate being the first input terminal of the data writing module, a source being the second input terminal of the data writing module and a drain being the output terminal of the data writing module; and at the write phase, the first switch transistor turns on under the write control signal, so as to provide the data signal to the source of the driving transistor.

11. The driving method according to claim 9, wherein the compensating module comprises a second switch transistor and a third switch transistor, the second switch transistor having a gate being the second input terminal of the compensating module, a source connected to the gate and the drain of the third switch transistor, and a drain being the output terminal of the compensating module, and the third switch transistor having a source being the first input terminal of the compensating module, the threshold voltage of the third switch transistor being the preset threshold voltage; and at the write phase, the second switch transistor turns on under the control of the compensation control signal, and the third switch transistor has a turn-on diode structure; the reference voltage is inputted to the gate of the driving transistor via the turn-on diode structure and the second switch transistor.

12. The driving method according to claim 9, wherein the light-emitting control module comprises a fourth switch transistor having a gate being the second input terminal of the light-emitting control module, a source being the first input terminal of the light-emitting control module, and a drain being the first output terminal of the light-emitting control module, and a fifth switch transistor having a gate connected to the gate of the fourth switch transistor, a source being the third input terminal of the light control-emitting module, and a drain being the second output terminal of the light-emitting control module; and at the light phase, the fourth switch transistor and the fifth switch transistor both turn on under the control of the light-emitting control signal; the voltage of the first reference voltage source is inputted to the source of the driving transistor via the fourth switch transistor, and the driving current outputted from the drain of the driving transistor is outputted to the light-emitting element via the fifth switch transistor.

13. An organic electroluminescence display panel, comprising a plurality of pixel elements arranged in a grid, the pixel elements each comprising the pixel circuit according to claim 1.

14. The organic electroluminescence display panel according to claim 13, wherein the compensating module of the pixel circuit comprises a second switch transistor and a third switch transistor, the second switch transistor having a gate being the second input terminal of the compensating module, a source connected to the gate and drain of the third switch transistor, and a drain being the output terminal of the compensating module, the third switch transistor having a source being the first input terminal of the compensating module, the threshold voltage of the third switch transistor being the preset threshold voltage; and two pixel elements adjacent in a row constitute a group of pixel elements, and two pixel circuits in the same group of pixel elements share the third switch transistor.

15. A display apparatus, comprising the organic electroluminescence display panel according to claim 13.

* * * * *